US012765110B2

(12) United States Patent
Kanda et al.

(10) Patent No.: US 12,765,110 B2
(45) Date of Patent: Oct. 13, 2026

(54) LIGHT-RECEIVING ELEMENT AND LIGHT RECEIVING CIRCUIT

(71) Applicant: NTT, Inc., Tokyo (JP)

(72) Inventors: Atsushi Kanda, Musashino (JP); Yasuhiko Nakanishi, Musashino (JP); Toshihide Yoshimatsu, Musashino (JP); Masahiro Nada, Musashino (JP)

(73) Assignee: NTT, Inc., Tokyo (JP)

( * ) Notice: Subject to any disclaimer, the term of this patent is extended or adjusted under 35 U.S.C. 154(b) by 473 days.

(21) Appl. No.: 18/550,857

(22) PCT Filed: Apr. 19, 2021

(86) PCT No.: PCT/JP2021/015875

§ 371 (c)(1),
(2) Date: Sep. 15, 2023

(87) PCT Pub. No.: WO2022/224308

PCT Pub. Date: Oct. 27, 2022

(65) Prior Publication Data

US 2024/0222532 A1 Jul. 4, 2024

(51) Int. Cl.

*H10W 90/00* (2026.01)
*H10F 77/00* (2025.01)
(Continued)

(52) U.S. Cl.

CPC ......... *H10F 77/206* (2025.01); *H10F 77/933* (2025.01); *H10W 90/00* (2026.01); (Continued)

(58) Field of Classification Search

CPC ... H10F 77/206; H10F 77/933; H01L 25/167; H01L 24/05; H01L 24/06; H01L 24/48; (Continued)

(56) References Cited

U.S. PATENT DOCUMENTS 6,043,550 A * 3/2000 Kuhara ............... H10F 30/2215 257/233
2001/0042869 A1* 11/2001 Fujimura ............ H10F 77/1248 257/E31.022
(Continued)

FOREIGN PATENT DOCUMENTS

JP 2000-036615 A 2/2000
JP 2001-267620 A 9/2001
(Continued)

*Primary Examiner* — Benjamin Tzu-Hung Liu
(74) *Attorney, Agent, or Firm* — Workman Nydegger

(57) ABSTRACT

A light receiving element of the present disclosure adopts a configuration in which a path of a return current is minimized, and achieves excellent high-frequency transmission characteristics. In the light receiving element of the present disclosure, not only a signal path of a high-frequency electric signal processed by an optical receiving circuit but also a path of a return current returning through a ground side are straightened. A return current flowing in a direction opposite to a high-frequency signal from a PD flows in a ground pattern formed on a lower surface of the PD, which is in contact with ground potential of a PD sub-mount. The ground pattern on the lower surface of the PD realizes a flat high-frequency transmission characteristic, and in a multi-channel PD array, unnecessary resonance and radiation noise are suppressed, and inter-channel crosstalk is effectively reduced.

5 Claims, 17 Drawing Sheets

(51) Int. Cl.

| | |
|---|---|
| ***H10F 77/20*** | (2025.01) |
| *H10W 72/00* | (2026.01) |
| *H10W 72/50* | (2026.01) |
| *H10W 72/90* | (2026.01) |

(52) U.S. Cl.
CPC .... *H10W 72/07554* (2026.01); *H10W 72/547* (2026.01); *H10W 72/932* (2026.01); *H10W 72/9445* (2026.01); *H10W 90/751* (2026.01); *H10W 90/753* (2026.01); *H10W 90/759* (2026.01)

(58) Field of Classification Search
CPC ........... H01L 24/49; H01L 2224/05554; H01L 2224/06135; H01L 2224/48091; H01L 2224/48137; H01L 2224/48195; H01L 2224/48221; H01L 2224/49109; H01L 2924/12043; H01L 2924/141; H01L 2924/19041; H01L 2924/19105; H10W 90/00; H10W 72/07554; H10W 72/547; H10W 72/932; H10W 72/9445; H10W 90/751; H10W 90/753; H10W 90/75
See application file for complete search history.

(56) References Cited

U.S. PATENT DOCUMENTS

2003/0152391 A1* 8/2003 Kuhara .................. H04B 10/85 398/164
2012/0292731 A1 11/2012 Toyonaka et al.

FOREIGN PATENT DOCUMENTS

JP 2003-232967 A 8/2003
JP 2012-256853 A 12/2012
JP 5296838 B2 9/2013

* cited by examiner

LIGHT-RECEIVING ELEMENT AND LIGHT RECEIVING CIRCUIT

TECHNICAL FIELD

The present invention relates to an optical communication, and more particularly to a light receiving element and an optical receiving circuit.

BACKGROUND ART

A transmission rate required for an optical communication system is increasing year by year. As the transmission speed is increased, there is an increasing demand for a wide band for a light receiving element for converting an optical signal into an electric signal and an optical receiving circuit using the same. For this demand, in addition to a technique for increasing a transmission rate per one channel, progress has been made in techniques for increasing a transmission rate by processing a plurality of channel signals in parallel and multiplexing optical signals corresponding to parallelized electric signals by wavelength division or the like. When the eyes are directed to the light receiving elements, a technique is required for receiving multi-channel optical signals by one light receiving element and converting them into electric signals in a lump by one optical receiving circuit.

The above-mentioned optical receiving circuit includes a transimpedance amplifier (TIA) for converting a current signal obtained by the light receiving element into a voltage signal and amplifying and outputting the voltage signal in addition to the light receiving element. As a light receiving element for high-speed optical communication, a photodiode (PD) is exclusively used. An integrated technique for converting a multi-channel optical signal into a multi-channel electric signal by mounting a plurality of PDs in an array on one PD array chip has been developed. A multi-channel optical receiving circuit using a PD array chip uses a multi-channel TIA having a plurality of input/output signal terminals, and can convert a multi-channel current signal into a voltage signal by one TIA chip, and can amplify and output the voltage signal (PTL 1).

FIG. 11 is a diagram showing a structure of a back-illuminated PD for high-speed optical transmission according to the prior art. FIG. 11 (*a*) is a top view of an element constituting surface (x-y surface) of the back-illuminated PD viewed from above, FIG. 11 (*b*) is a view of a back side of the element constituting surface, and FIG. 11 (C) is a cross-sectional view of the back-illuminated PD cut perpendicularly to the substrate surface along the XIc-XIc line of (a). Referring to FIG. 11 (*a*), a light receiving area 15 for receiving an optical signal, an anode electrode pad 11 connected to an anode, and a cathode electrode pad 12 connected to a cathode are formed on the upper surface of the PD1. As shown in (c), an optical signal 2 made incident from the lower surface side of the PD1 is transmitted through the PD, converted from the optical signal into an electric signal by the light receiving area 15 formed on the upper surface, and the electric signal is outputted from the anode electrode and the cathode electrode. In the case where the optical receiving circuit is constituted by the back-illuminated PD shown in FIG. 11, as will be described later, a mounting mode is employed in which a PD chip is mounted on a PD sub-mount provided with a through hole and an optical signal is made incident through the through hole. Therefore, the lower surface (rear surface) side of the PD1 to which the light shown in FIG. 11 (*b*) is made incident becomes a mounting surface to a sub-mount, and no electrode or the like is formed.

FIG. 12 is a diagram showing an example of mounting an optical receiving circuit for high-speed transmission in the prior art. FIG. 12 (*a*) is a top view of the side on which the PD chip and others are mounted, and FIG. 12 (*b*) is a cross-sectional view of the optical receiving circuit cut along a line XIIb-XIIb in the top view of (a). Since the optical receiving circuit shown in FIG. 12 is constructed on a substrate surface or the like in various forms such as a receiving device and an optical module, a substrate serving as a base is not shown in FIG. 12. This also applies to figures of other optical receiving circuit described later. FIG. 12 shows a mounting form of the optical receiving circuit using the PD1 for inputting an optical signal 2 of one channel and outputting an electric signal of one channel. The optical receiving circuit is roughly composed of a PD sub-mount 40 and a TIA carrier 42. The back-illuminated PD1 and a chip capacitor 30 are mounted on a PD sub-mount 40 whose surface is metallized. A TIA 20 is mounted on the TIA carrier 42 whose surface is metallized.

The PD sub-mount 40 is provided with the through-hole 41 for making the optical signal 2 incident from the lower surface of the PD1. Normally, in order to avoid the influence of the reflected return light, the optical signal 2 is made incident on the PD light receiving area 15 at an angle shifted from the normal direction. The optimum angle varies depending on design conditions such as an optical system configuration and material of the PD, a wavelength of light, and a transmission rate handled by the PD. A degree of freedom (margin) is also required in accordance with a mounting condition and a manufacturing condition at a mounting position of the PD1 to the sub-mount 40. As a result, a diameter of the through-hole 41 is sufficiently larger than a light receiving diameter of the PD light receiving area 15.

The TIA 20 includes a signal pad 21 for inputting an electric signal from the PD1, signal pads 22*a* and 22*b* for outputting a differential electric signal to the outside, ground pads 23*a* to 23*e*, and power supply, operation control of the TIA, power supply/control/monitor pad 24 for monitoring is provided.

The chip capacitor 30 connected to a cathode electrode pad 12 is also mounted on the PD sub-mount 40. The chip capacitor 30 assumes a role of a relay terminal which applies DC voltage to the cathode electrode 12 of the PD1 from the outside and operates so as to separate an AC component and a DC component from each other and block leakage of an AC signal to the outside.

A bonding wire 51 is used to electrically connect an anode electrode pad 11 of the PD1 and an input signal pad 21 of the TIA 20. A bonding wire 52 is used to electrically connect the cathode electrode pad 12 of the PD1 and the chip capacitor 30. A bonding wire 57 is used to electrically connect the ground pad 23 of the TIA 20 and a ground potential of the PD sub-mount 40.

FIG. 13 is a diagram showing another structure of the back-illuminated PD for high-speed optical transmission according to the prior art. Similarly to FIG. 11, FIG. 13 (*a*) is a top view of the element constituting surface (x-y surface) of the back-illuminated PD viewed from above, FIG. 13 (*b*) is a view of the rear side of the element constituting surface, and FIG. 13 (*c*) is a cross-sectional view taken along the line XIIIc-XIIIc of (a) perpendicular to the substrate surface.

The difference from the structure of the PD shown in FIG. 11 is that a lens 17 is provided at a position corresponding to the light receiving area 15 on the lower surface side of the element. The lens 17 has a curvature at which the optical signal 2 incident from the lower surface side of the element is converged at the light receiving area. By integrating the lens 17 on the PD1, an optical coupling efficiency is improved, and deterioration of the mounting tolerance can be prevented. Since alignment between the lens and the PD is not required, the mounting cost of the optical receiving circuit can be reduced.

FIG. 14 is a diagram showing still another structure of the back-illuminated PD for high-speed optical transmission according to the prior art. Similarly to FIG. 11, FIG. 14 (*a*) is a top view of the element constituting surface (x-y surface) of the back-illuminated PD viewed from above, FIG. 14 (*b*) is a view of the rear side of the element constituting surface, and FIG. 14 (*c*) is a cross-sectional view taken along the line XIVc-XIVc of (a) perpendicular to the substrate surface. The PD shown in FIG. 14 is a PD array chip 101, and four back-illuminated PD1 shown in FIG. 11 are arranged and integrated into one chip. One PD array chip 101 can convert the four-channel optical signals into four-channel electric signals. By integrating the four PDs into one chip, the mounting cost of the optical receiving circuit can be reduced as compared with the case where the four PD chips are separately mounted.

FIG. 15 is a diagram showing an example of mounting an optical receiving circuit for high-speed transmission by a PD array chip. FIG. 15 (*a*) is a top view of the side on which the PD chip array and others are mounted, and FIG. 15 (*b*) is a cross-sectional view of the optical receiving circuit cut along line XVb-XVb in the top view of (a). FIG. 12 shows the optical receiving circuit using one-channel PD, while FIG. 15 shows an optical receiving circuit for inputting a multi-channel optical signal and outputting a multi-channel electric signal by using a PD array chip 101. The PD array 101 and the chip capacitor 300 are mounted on a PD sub-mount 400 whose surface is metallized. The TIA 200 is mounted on the TIA carrier 420 whose surface is metallized.

The PD sub-mount 400 is provided with a single through-hole 410 large enough to provide four channels through which the optical signals 2 of four channels are to be incident from the rear surface of the PD array 101. As already described with reference to FIG. 12, the optical signal 2 is made incident on the PD light receiving area at an angle shifted from the normal direction, and a certain degree of freedom is required for the mounting position of the PD array 101 with respect to the sub-mount 400. In addition, because of the ceramic processing accuracy which is the material of the PD sub-mount 400 and the size of the through-hole which can be processed, the dimensions of the end and the short side of the through-hole 410 must be sufficiently larger than the light receiving diameter of the PD light receiving area.

The TIA chip 200 is a multi-channel TIA having amplifier circuits of four systems, and includes input signal pads 210, output signal pads 220 *a*, 220 *b* for four channels, ground pads 230*a* to 230*e*, and a power supply/control/monitor pad 240. Bonding wires 510 are used to electrically connect the 4 anode electrode pads 110 of the PD array 101 and the 4 signal pads 210 for input of the TIA 200. Bonding wires 520 are used to electrically connect the 4 cathode electrode pads 120 of the PD array 101 and the 4 chip capacitors 300 to each other. Bonding wires 570 are used to electrically connect the ground pads 230*a* and 230*b* of each amplifier circuit of 4 systems of the TIA 200 and the ground potential of the PD sub-mount 400 to each other.

CITATION LIST

Patent Literature

[PTL 1] Japanese Patent No. 5296838

SUMMARY OF INVENTION

Technical Problem

However, as the transmission rate of the optical communication system increases, the problem that the limitation on the mounting of the PD adversely affects the high-frequency characteristics of the optical receiving circuit has become obvious. In any of the optical receiving circuits described above using the PD of the prior art, disturbance of the electromagnetic field occurs in the path of the high-frequency signal. The disturbance of the electromagnetic field of the high-frequency signal deteriorates the high-frequency transmission characteristic from the PD to the TIA, and the problem arises so that unnecessary resonance and radiation noise are likely to occur. These problems particularly affect the optical receiving circuit using the multi-channel PD array. The bonding wire in the optical receiving circuit functions as an antenna, and there is a problem that transmission quality is deteriorated by a crosstalk signal radiated from the bonding wire of an adjacent channel.

The present invention has been made in view of the foregoing problems, and an object thereof is to provide the light receiving element and the optical receiving circuit with excellent high-frequency transmission characteristics.

Solution to Problem

One embodiment of the present invention is a light receiving element, the light receiving element includes a light receiving area for an optical signal, an anode electrode pad being connected to an anode of the light receiving area, a cathode electrode pad being connected to a cathode of the light receiving area, the light receiving area, the anode electrode pad and the cathode electrode pad being formed on one surface of a substrate and a ground pattern being formed outside an opening region on an opposite surface opposite of the substrate, the opening region being located at a position corresponding to the light receiving area.

Advantageous Effects of Invention

A light receiving element and an optical receiving circuit are provided, which have excellent high-frequency transmission characteristics, suppress unnecessary resonance and radiation noise, and reduce inter-channel crosstalk.

DESCRIPTION OF EMBODIMENTS

The light receiving element of the present disclosure achieves excellent high-frequency transmission characteristics by adopting a configuration in which a path of a return current is minimized. The inventors have focused on the path of the reciprocation of the high-frequency signal transmitted from the light receiving element to the TIA. In the light receiving element of the present disclosure, not only a signal path of a high-frequency electric signal processed by an optical receiving circuit but also a path of a return current returning to the ground side are straightened. The return current flowing in a direction opposite to the high-frequency signal from the PD flows in a ground pattern formed on the lower surface of the PD in contact with the ground potential of the PD sub-mount. The ground pattern on the lower surface of the PD realizes excellent high-frequency transmission characteristics, and in particular, in a multi-channel PD array, unnecessary resonance and radiation noise are suppressed, and inter-channel crosstalk is effectively reduced.

Hereinafter, first, problems in the conventional light receiving element will be described in more detail, and subsequently, the structure of the light receiving element of the present disclosure will be described with reference to the structure of the conventional technology.

Figure 16:
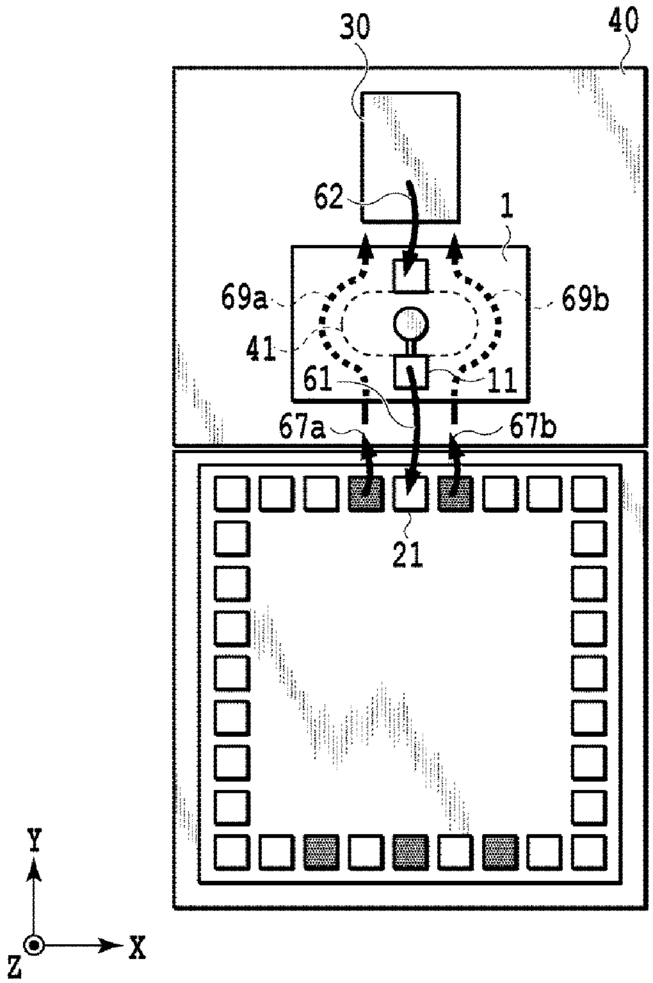
FIG. 16 is a diagram showing a path of a return current of the optical receiving by the PD according to the prior art.

FIG. 16 is a diagram for explaining the path of the return current in the optical receiving circuit using the back-illuminated PD of the prior art. In FIG. 16, a photocurrent generated by the PD 1 of the prior art shown in FIG. 12 and the return current corresponding to the photocurrent are shown by arrows without drawing the bonding wires. The photocurrent generated from the signal light 2 in the PD light receiving area 15 flows into the TIA input signal pad 21 from the PD anode electrode pad 11 via the bonding wire 51 as a high-frequency signal current 61. Return currents 67 and 69 flow from the TIA 20 in the opposite direction to the transmission of the signal current 61 toward the TIA 20. The return currents 67 and 69 flow from the ground pads **23*a* and 23*b* to the ground potential surface of the PD sub-mount 40 through the respective bonding wires 57**.

The surface of the PD sub-mount 40 is covered (metallized) with a metal by vapor-depositing a metal film, and at least a part on which the PD 1 is mounted and its periphery, preferably the whole surface, are metallized. The metallized metal surface electrically has a reference ground potential in the optical receiving circuit, and in this specification, the metallized metal surface is also referred to as a ground potential surface. Return currents 67 and 69 indicated by dotted arrows on the PD sub-mount 40 shown in FIG. 16 flow on the ground potential surface.

Since the PD sub-mount 40 has the through-hole 41 through which the signal light 2 is made incident from just under the PD 1, the return currents 67 and 69 flow on the ground potential surface around the through-hole 41. That is, the return current is prevented from going straight, and flows so as to bypass the periphery of the through-hole 41. The bypass of the return current path may deteriorate the high-frequency transmission characteristics and cause unnecessary resonance and radiation noise. This problem is more influenced by an optical receiving circuit using a multi-channel PD array.

Figure 17:
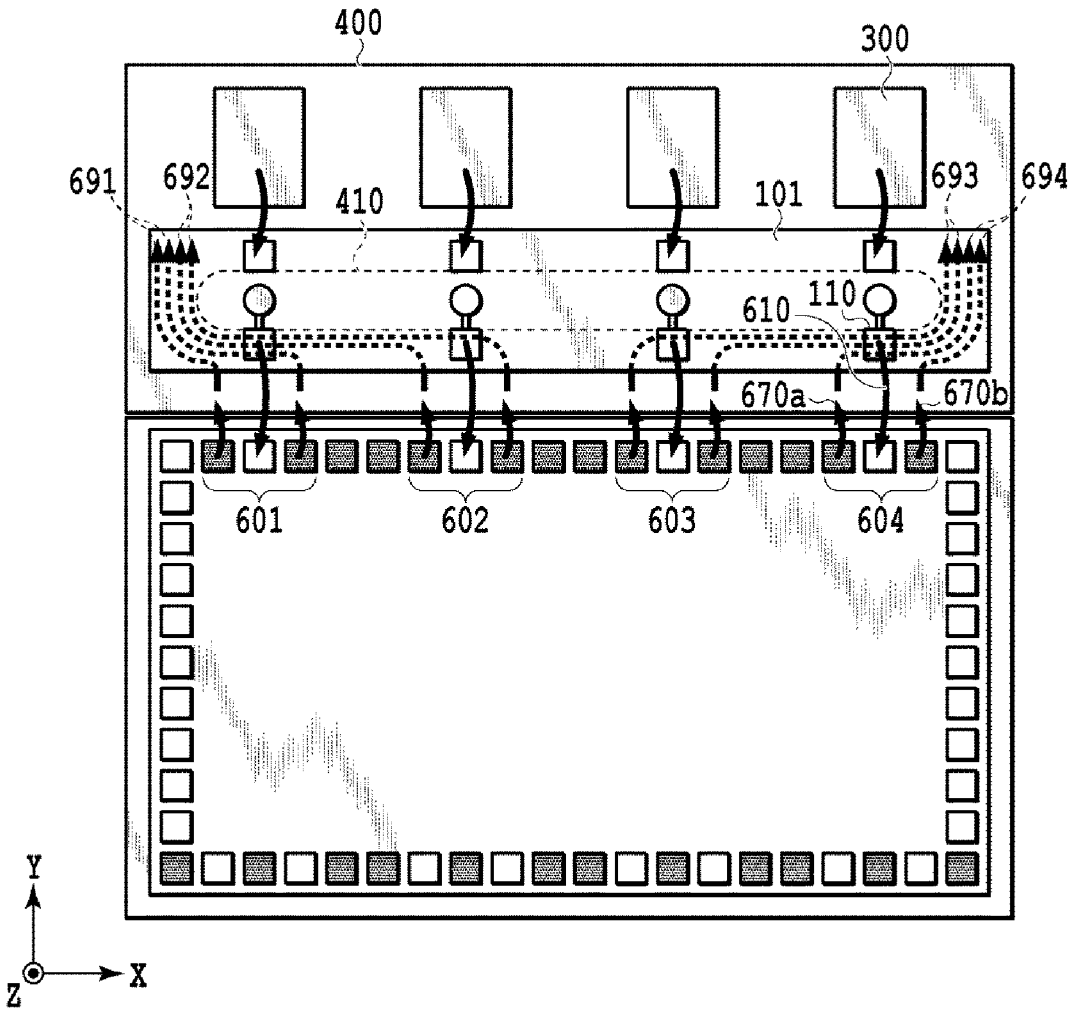
FIG. 17 is a diagram showing a path of a return current of the optical receiving circuit by the PD array chip.

FIG. 17 is a diagram for explaining the path of the return current in the optical receiving circuit using the back-illuminated PD array of the prior art. In FIG. 17, in the PD array 101 of the prior art shown in FIG. 15, a photocurrent generated in the four channels 601 to 604 and a return current corresponding to the photocurrent are shown by arrows without drawing bonding wires. The photocurrent generated from the signal light 2 in each light receiving area 150 of the four PDs flows into the TIA input signal pad 210 from the PD anode electrode pad 110 via the bonding wire 510 as a signal current 610. Return currents 691 to 694 flow from the TIA 200 in opposite directions to transmission of four high-frequency signal currents 610 toward the TIA 200.

When attention is paid to the channel 601 on the left side of the TIA chip in FIG. 17, the return current 691 flows from the ground pads **230*a* and 230*b* to the ground potential surface of the PD sub-mount 400 through the bonding wire 570. The return current 691 bypasses the left end of the through-hole 410 of the PD sub-mount 400 and flows on the ground potential surface. Also in the channel 604 on the right side of FIG. 17, the return current 694 flows on the ground potential surface symmetrically with respect to the return current 691 with bypassing the right end of the through-hole 410**.

When attention is paid to the channel 602 on the inner side of FIG. 17, the return current 692 flows from the ground pads **230*a* and 230*b* to the ground potential surface of the PD sub-mount 400 through the bonding wire 570. The return current 692 flows on the ground potential surface of the PD sub-mount 400 along the longitudinal direction of the through-hole from the bonding wire connection point with further bypassing around the left end of the through-hole. As compared with the channel 601 located near the periphery of the PD array chip, the degree of bypass of the return current of the channel 602 located inside the chip is remarkable. When the number of PDs of the PD array chip increases, a current loop having a large opening is formed by a signal current path from the chip capacitor 300 serving as the ground reference point of the high-frequency signal to the signal pad 210** and a return current path. The problem of the bypass of the return current is a serious problem especially in the PD array chip.

For the reason of the ceramic processing accuracy, it is difficult to form a structure in which four small through-holes are arranged for each channel instead of the single through-hole 410 of the PD sub-mount 400. As shown in FIG. 17, it is necessary to adopt a structure in which the through-holes for four channels are combined into one large hole. As described above, the bypass distance of the return current increases in the channel inside the chip (center side) of the multi-channel optical receiving circuit. Therefore, in the optical receiving circuit using the PD array chip of the prior art, degradation of high-frequency transmission characteristics is significant and unnecessary resonance, radiation noise are likely to occur, particularly in inner channels.

When the resonance occurs in a signal transmission path between the PD and the TIA, reflection and absorption of energy of a specific frequency may occur in a detected output from the PD. That is, the transmission characteristic of the specific frequency is steeply deteriorated (attenuated), and conversely, the specific frequency is excited to have a peak like a spike. Further, a peak signal in its own channel acts as noise on other channels. The bypass of the return current leads to such deterioration of the high-frequency transmission characteristics.

Figure 15:
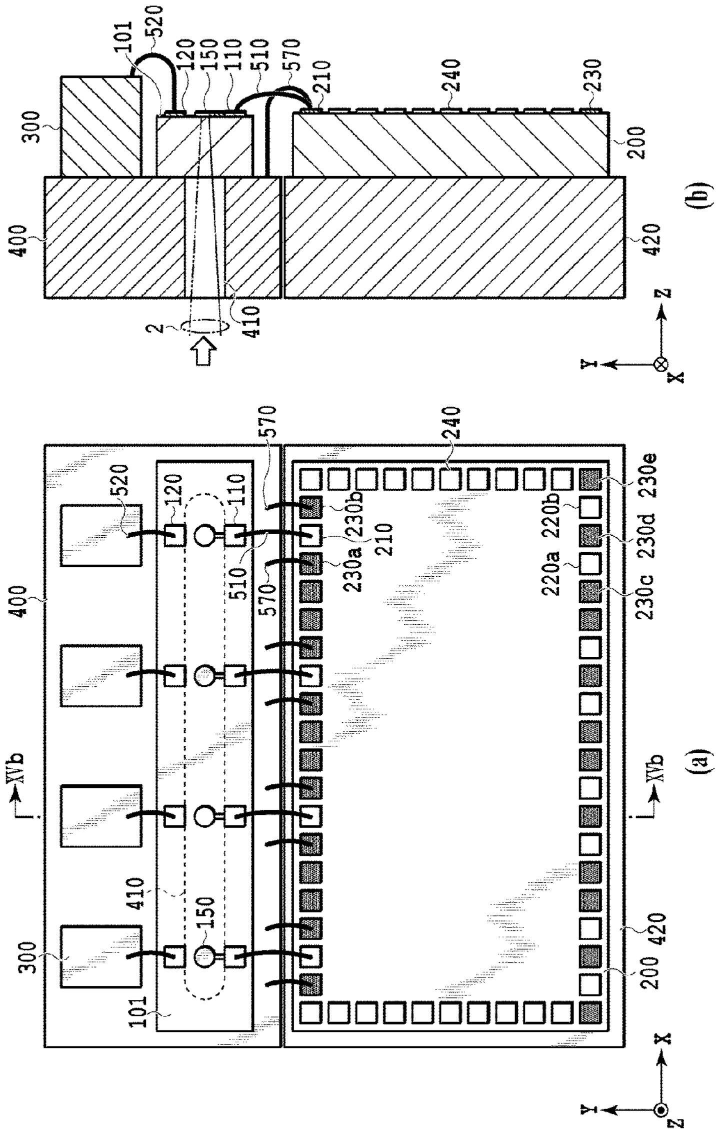
FIG. 15 is a diagram showing a mounting example of an optical receiving circuit using a PD array chip.

In addition, in the optical receiving circuit using the multi-channel PD array as shown in FIG. 15, the distance between adjacent channels is close to the same extent as the bonding wire length (e.g., about 0.5 mm). The bonding wire functions as a transmitting antenna and a receiving antenna. If the unnecessary resonance and radiation noise are generated in a channel, the electromagnetic wave radiated from the bonding wire of the channel is easily picked up by the bonding wire of the adjacent channel. The signal leaked from the adjacent channel is superimposed on the signal of its own channel, and is easily affected by so-called crosstalk. For example, in a signal having a transmission rate of around 10 Gbaud or higher, ¼ wavelength in free space becomes the same length or less as the bonding wire. In this way, the bonding wire functions as the antenna, and there is a problem that a transmission quality is deteriorated due to crosstalk from an adjacent channel.

In the following, structures of the light receiving element and the optical receiving circuit of the present disclosure, a high-frequency signal, and a corresponding return current will be described.

Embodiment 1

Figure 1:
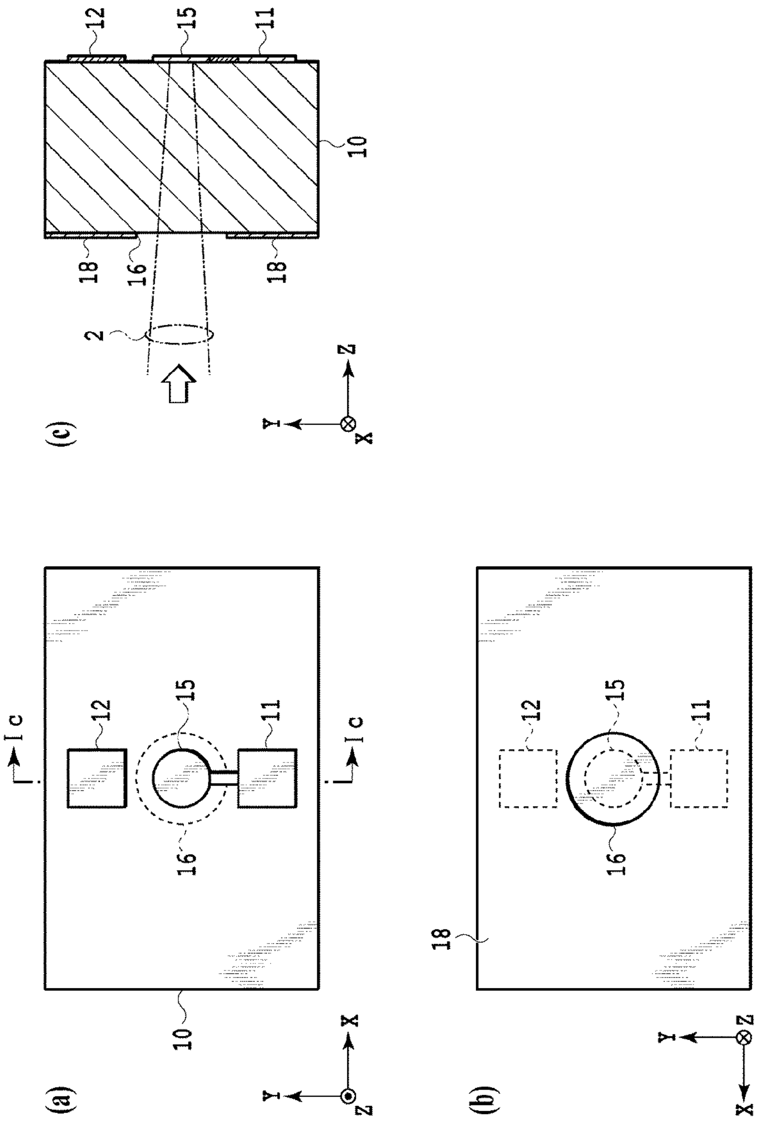
FIG. 1 is a diagram showing a configuration of a light receiving element according to a first embodiment.
Figure 11:
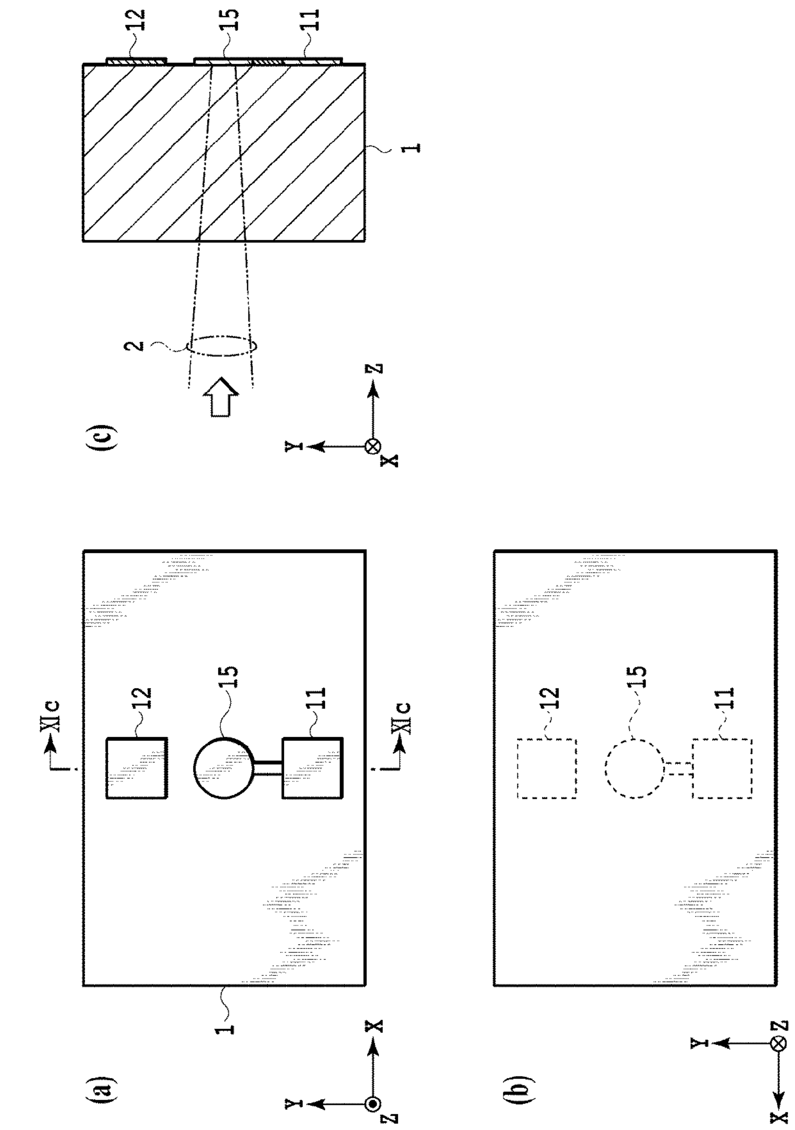
FIG. 11 is a diagram showing a configuration of a back-illuminated PD for high-speed optical transmission according to the prior art.

FIG. 1 is a diagram showing a configuration of a light receiving element according to embodiment 1. Similarly to FIG. 11, a back-illuminated PD 10 is shown, in which (a) is a top view of a constituting surface (x-y surface) of a light receiving element viewed from above, (b) is a back view of a rear side of the constituting surface, and (c) is a cross-sectional view cut perpendicularly to a substrate surface along an Ic-Ic line of (a).

A light receiving area 15 for receiving an optical signal, an anode electrode pad 11 connected to an anode, and a cathode electrode pad 12 connected to a cathode are formed on an upper surface of the PD 10 which is the light receiving element for high-speed optical communication. As shown in (c), the optical signal 2 incident from the lower surface side of the PD 10 is transmitted through the PD and converted from an optical signal into an electric signal by the light receiving area 15 formed on the upper surface. The electric signal is outputted from the anode electrode and the cathode electrode. As will be described later, the cathode electrode is grounded via a chip capacitor, so that a high-frequency signal current is taken out from the anode side to the outside. As in FIG. 11, when the optical receiving circuit is constituted by the back-illuminated PD 10, a mounting mode is used in which the PD chip is mounted on a PD sub-mount provided with a through-hole and the optical signal is made incident through the through-hole. The light receiving element 10 of the present embodiment is different from the structure of the prior art in that a ground pattern 18 is formed on the entire lower surface of the PD except for an opening region 16 through which the optical signal is incident.

In the back-illuminated PD 10 shown in FIG. 1, signal light is made incident on the PD chip from the opposite side (the lower surface of PD) of the element constituting surface on which the light receiving area and the electrode pad are formed. Therefore, it is not necessary to input and output other signals on the lower surface of the PD, and it becomes an obstacle for mounting the PD on the PD sub-mount. In addition, even if signal pads or the like are formed, the chip structure becomes complicated and the chip manufacturing cost is increased. Therefore, the element components and electrodes are not formed on the lower surface side of the PD, and the substrate material of the PD chip is exposed as it is. The inventors of the present invention have obtained the idea of utilizing the lower surface of the PD as a return current path by forming the ground pattern on the lower surface of the PD which has not been used so far. The substrate material of the PD is usually a semiconductor, and a metal film or the like is deposited on the surface of the semiconductor to metallize the surface by a simple process. A thin metal film is sufficient to form the ground potential to a high-frequency current. Further, the ground pattern on the lower surface of the PD does not affect the process of mounting the PD on the PD sub-mount.

Therefore, the light receiving element 10 of the present disclosure includes the light receiving area 15 for the optical signal, the anode electrode pad 11 connected to the anode of the light receiving area, the cathode electrode pad 12 connected to the cathode of the light receiving area, and the ground pattern 18 formed on the surface opposite to the element constituting surface of the substrate and outside the opening region 16 located at a position corresponding to the light receiving area. The ground pattern 18 can be formed on the entire surface of the opposite surface except for the opening region.

Figure 2:
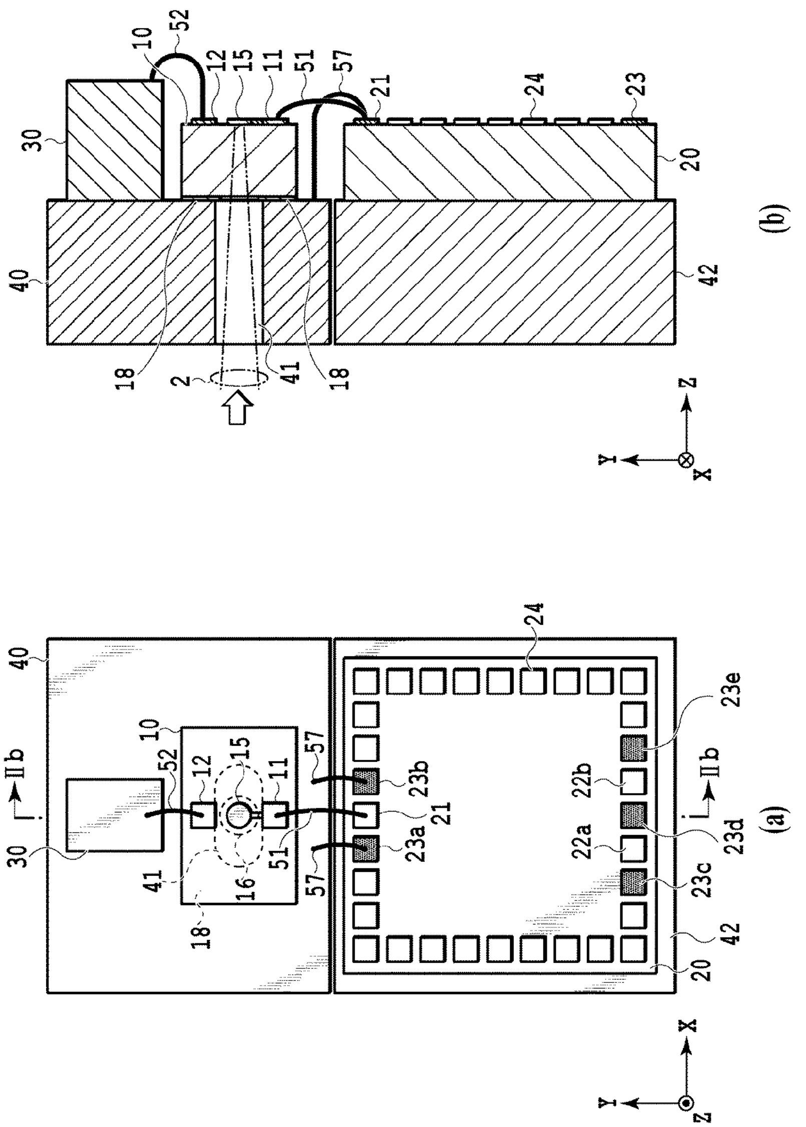
FIG. 2 is a diagram showing a mounting example of an optical receiving circuit using the light receiving element according to the first embodiment.

FIG. 2 is a diagram showing a mounting example of the optical receiving circuit using the light receiving element of the embodiment 1. FIG. 2 (*a*) is a top view of the side on which the PD chip and others are mounted, and FIG. 2 (*b*) is a cross-sectional view of the optical receiving circuit cut along line IIb-IIb in the top view of (a). Since the optical receiving circuit shown in FIG. 2 is mounted and constructed on a substrate surface or the like in various forms such as an optical receiving device and an optical receiving module, a substrate serving as a base is not shown in FIG. 2. In the optical receiving circuit shown in FIG. 2, there is shown a mounting form of the PD 10 for inputting the optical signal 2 of one channel and outputting the electric signal of one channel. The optical receiving circuit is roughly composed of two parts, i.e., a PD sub-mount 40 and a TIA carrier 42. The back-illuminated PD 10 and the chip capacitor 30 are mounted on the PD sub-mount 40 whose surface is metallized. The TIA chip 20 is mounted on the TIA carrier 42 whose surface is metallized.

The PD sub-mount 40 is provided with the through-hole 41 into which the optical signal 2 is to be incident from a lower surface of the PD 10. Normally, in order to avoid the influence of the reflected return light, the optical signal 2 is made incident on the PD light receiving area 15 at an angle shifted from the normal direction. As described in the prior art, the optimum incident angle varies depending on design conditions such as the optical system configuration and material of the PD, the wavelength of light, and the transmission rate handled by the PD, and a degree of freedom is required for the mounting position of the PD 10. A diameter of the through-hole 41 is sufficiently larger than a light receiving diameter of the PD light receiving area 15.

Figure 12:
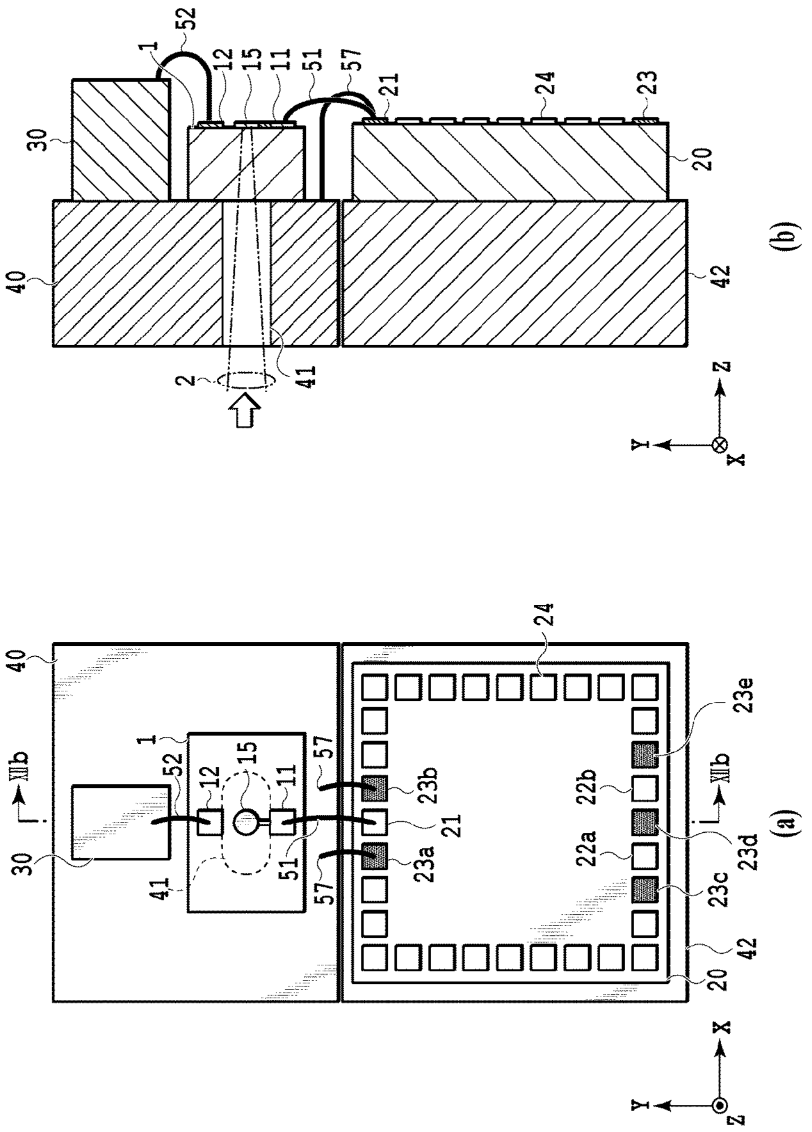
FIG. 12 is a diagram showing a mounting example of an optical receiving circuit using the back-illuminated PD according to the prior art.
Figure 13:
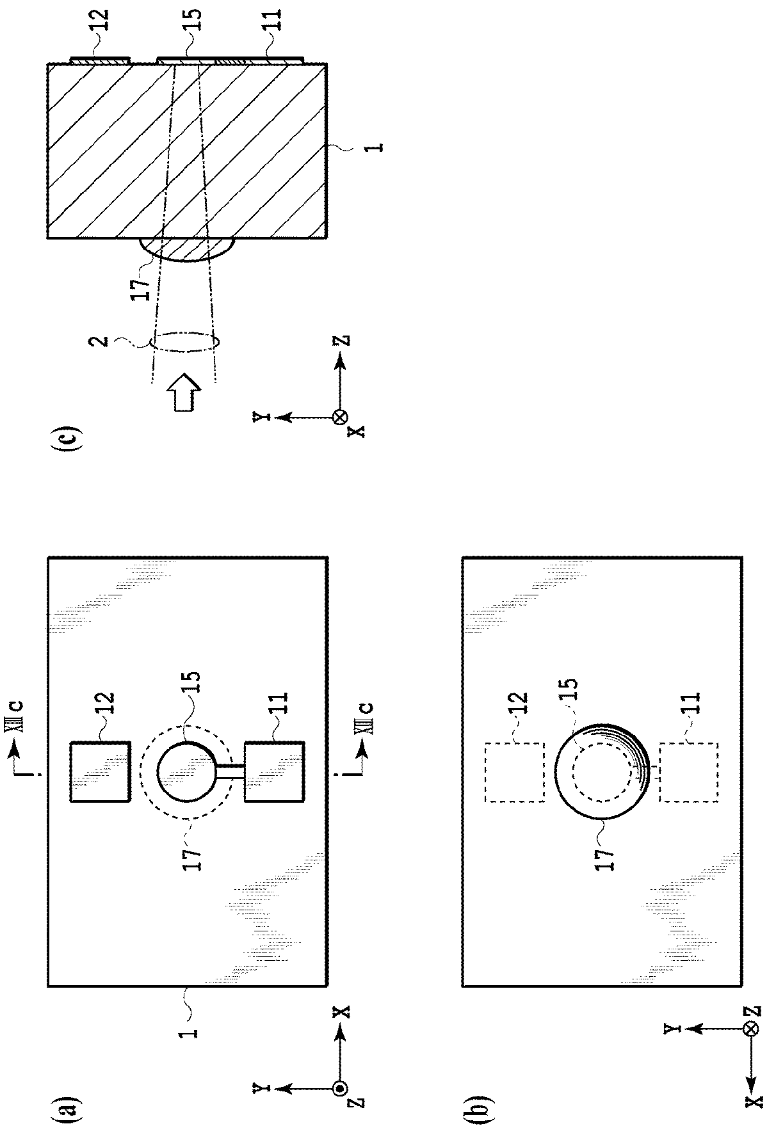
FIG. 13 is a diagram showing another configuration of the back-illuminated PD according to the prior art.
Figure 14:
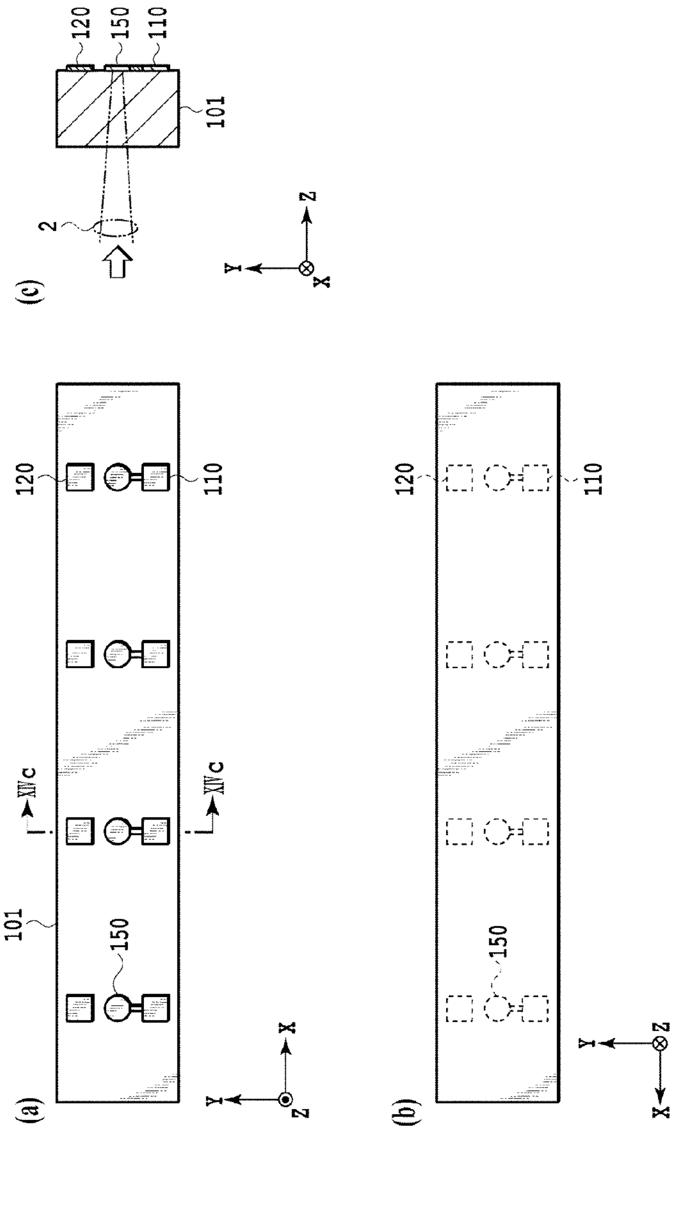
FIG. 14 is a diagram showing further another configuration of the back-illuminated PD according to the prior art.

The TIA 20 and the arrangement and connection configuration of each on the PD sub-mount 40 are identical with those of the conventional optical receiving circuit described with reference to FIG. 12, and detailed description thereof is omitted. The difference between the optical receiving circuit of FIG. 12 of the prior art and the optical receiving circuit of FIG. 2 using the light receiving element of the embodiment 1 is that the ground pattern 18 is formed on the lower surface of the PD 10, that is, on the surface on the side in contact with the PD sub-mount 40, except for the opening region 16.

Figure 3:
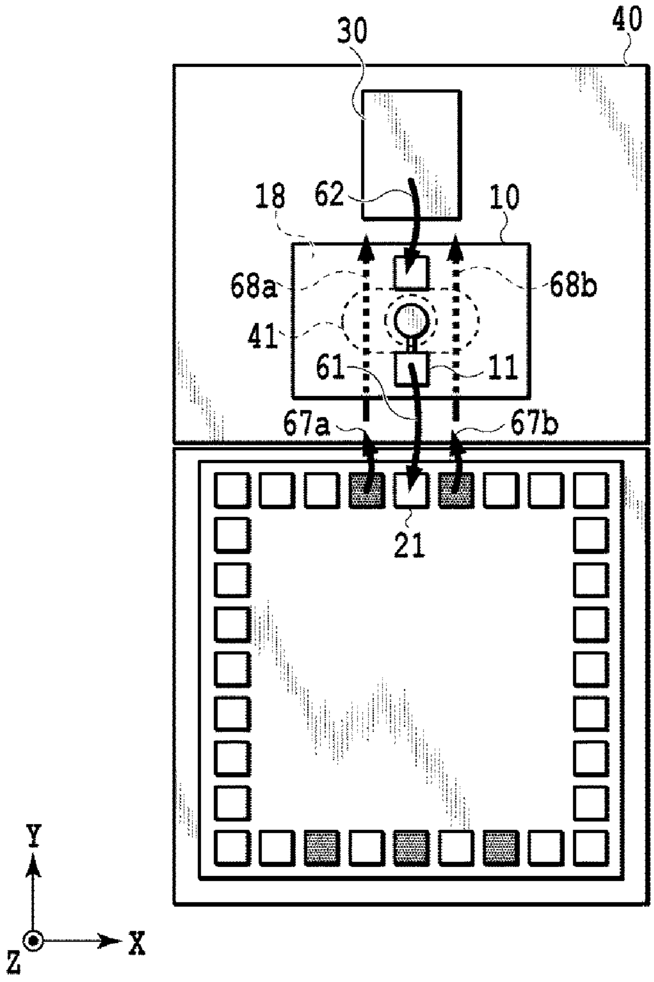
FIG. 3 is a diagram showing a path of a return current of the optical receiving circuit according to the first embodiment.

FIG. 3 is a diagram for explaining the path of the return current in the optical receiving circuit using the light receiving element of the embodiment 1. In FIG. 3, a photocurrent generated in the light receiving element of the embodiment 1 shown in FIG. 2 and the return current corresponding to the photocurrent are indicated by arrows without drawing the bonding wires. The photocurrent generated from the signal light 2 in the PD light receiving area 15 flows into the TIA input signal pad 21 from the PD anode electrode pad 11 via the bonding wire 51 as a high-frequency signal current 61. The cathode electrode pad 12 is grounded to the ground potential surface of the PD sub-mount 40 in terms of high frequency through the chip capacitor 30. The return current flows from the TIA 20 in a reverse direction to the transmission of the signal current 61 toward the TIA 20. The return currents 67*a* and 67*b* flow from the ground pads 23*a* and 23*b* to the ground potential surface of the PD sub-mount 40 through the respective bonding wires 57.

The return currents 67*a* and 67*b* flowing in from the bonding wire 57 further flow in the ground pattern 18 formed on the lower surface of the PD 10 in contact with the ground potential surface of the PD sub-mount 40 as the return currents 68*a* and 68*b*. The difference is clear as compared with the return currents 69*a* and 69*b* of the path bypassing the through-hole 41 shown in FIG. 17 in the conventional optical receiving circuit. In FIG. 3, the return currents 68*a* and 68*b* flowing through the ground pattern 18 on the lower surface of the PD reach the ground potential surface of the chip capacitor 30 at the shortest distance without bypassing. The signal current and the return current flow at the shortest distance so as to form a current loop with the minimum opening. By eliminating the bypass of the return current generated in the through-hole 41 by the ground pattern 18 on the lower surface of the PD, unnecessary resonance and radiation noise due to disturbance of the electromagnetic field of the high-frequency transmission line are suppressed, and flat high-frequency transmission characteristics are obtained.

Therefore, the present invention relates to an optical receiving circuit which includes a sub-carrier 40 having a metalized surface, the light receiving element 10 on the sub-carrier having a light receiving area 15 for an optical signal, an anode electrode pad 11 connected to an anode of the light receiving area, a cathode electrode pad 12 connected to a cathode of the light receiving area constituted on one surface of a substrate, and a ground pattern 18 formed outside an opening region 16 located at a position corresponding to the light receiving area on an opposite surface of the substrate, and a transimpedance amplifier 20 having a signal pad 21 electrically connected to the anode electrode pad, and ground pads 23*a* and 23*b* electrically connected to the metallized ground surface of the sub-carrier, wherein signal currents 61 and 62 flow from the cathode electrode pad to the signal input pad, while return currents can also be made to flow through paths 68*a* and 68*b* including the ground pattern from the ground pad.

In the light receiving element of the embodiment 1 of the present disclosure, the opening region 16 is formed concentrically at a position corresponding to the light receiving area 15 on the lower surface of the PD 10, and the entire surface excluding the opening region 16 is formed as the ground pattern. As shown in FIG. 3, if the bypass of the return current due to the through-hole is eliminated and the paths of the return currents 68*a* and 68*b* are secured so as to become the shortest path, the disturbance of the electromagnetic field of the high-frequency transmission line is eliminated. Therefore, the configuration of the ground pattern on the lower surface of the PD 10 is not limited to that shown in FIG. 1.

Figure 4:
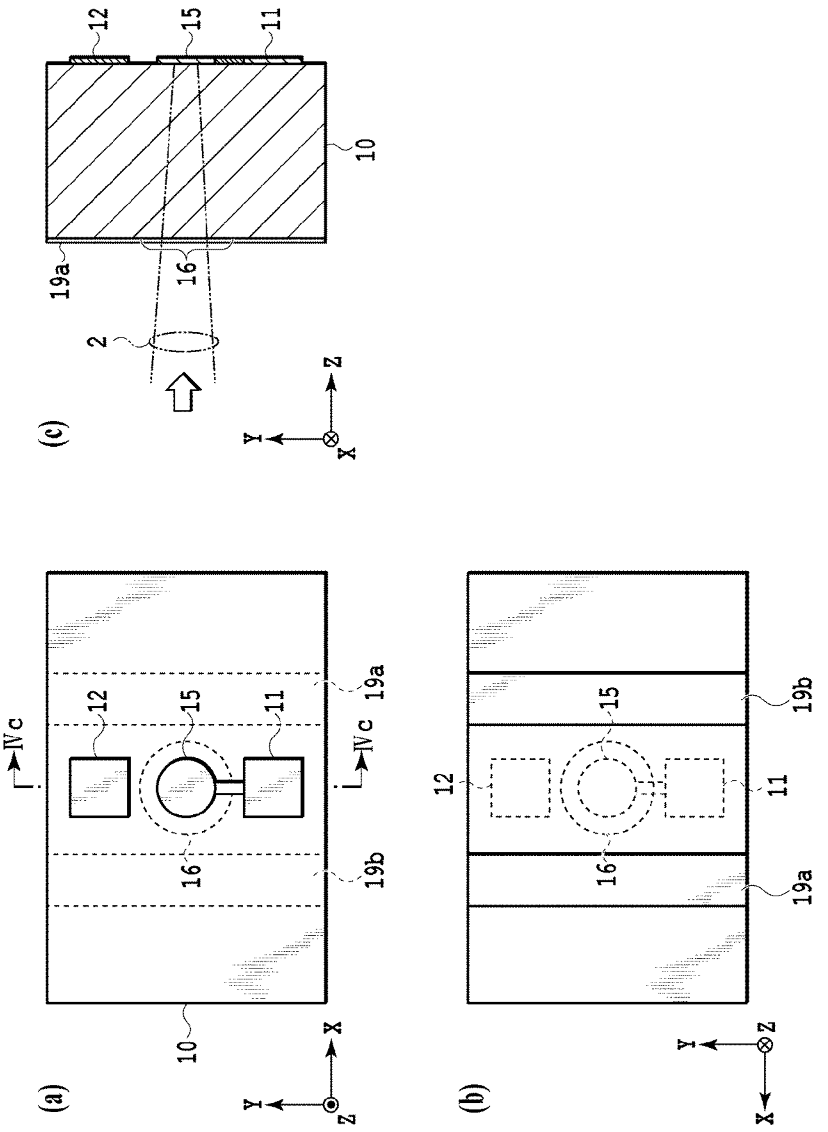
FIG. 4 is a diagram showing another configuration of a light receiving element according to the first embodiment.

FIG. 4 is a diagram showing a configuration of another ground pattern of the light receiving element of the embodiment 1. FIG. 4 (*a*) is a top view of the constituting surface (x-y surface) of the light receiving element viewed from above, FIG. 4 (*b*) is a back view of the rear side of the constituting surface, and FIG. 4 (*c*) is a cross-sectional view taken along the line IVc-IVc of (a) perpendicular to the substrate surface. The difference from the structure of the PD shown in FIG. 1 is only the shape of the ground pattern 19 on the lower surface of the PD. As shown in FIG. 4 (*b*), the bypass of the return current path can be eliminated by providing belt-like partial ground patterns 19*a* and 19*b* connecting the ends of the PD chips in a bridge shape almost in parallel with a line connecting the anode electrode 11 and the cathode electrode 12. Referring to the structure of the optical receiving circuit shown in FIG. 3, the direction in which the signal currents 62 and 61 flow is along a straight line connecting the anode electrode pad 11, the light receiving area 15 and the cathode electrode pad 12. If there is the ground pattern on the lower surface of the PD so that the return current is also parallel to and opposite to the flow of the signal current, the current loop is minimized and shortened as much as possible. In this respect, it is preferable that the anode electrode pad 11, the light receiving area 15 and the cathode electrode pad 12 are arranged as straight as possible.

Therefore, in the light receiving element of the present disclosure, the anode electrode pad 11, the light receiving area 15, and the cathode electrode pad 12 are arranged in a straight line, it is possible to execute the operation by having belt-like shapes 19*a* and 19*b* parallel to the straight line on both sides of the opening area. The arrangement of the anode electrode pad 11, the light receiving area 15 and the cathode electrode pad 12 may be substantially on the straight line, and as shown in FIG. 3, the signal current and the return current may be linearly formed to form a minimum current loop.

Usually, conductive adhesives, solder, etc. are used to fix the back-illuminated PD on the PD sub-mount whose surface is metallized. As shown in FIG. 4 (*b*), by providing a space between the ground patterns 19*a* and 19*b* and the opening region 16, the flow of the conductive adhesive, solder or the like into the opening region 16 can be avoided.

Embodiment 2

Figure 5:
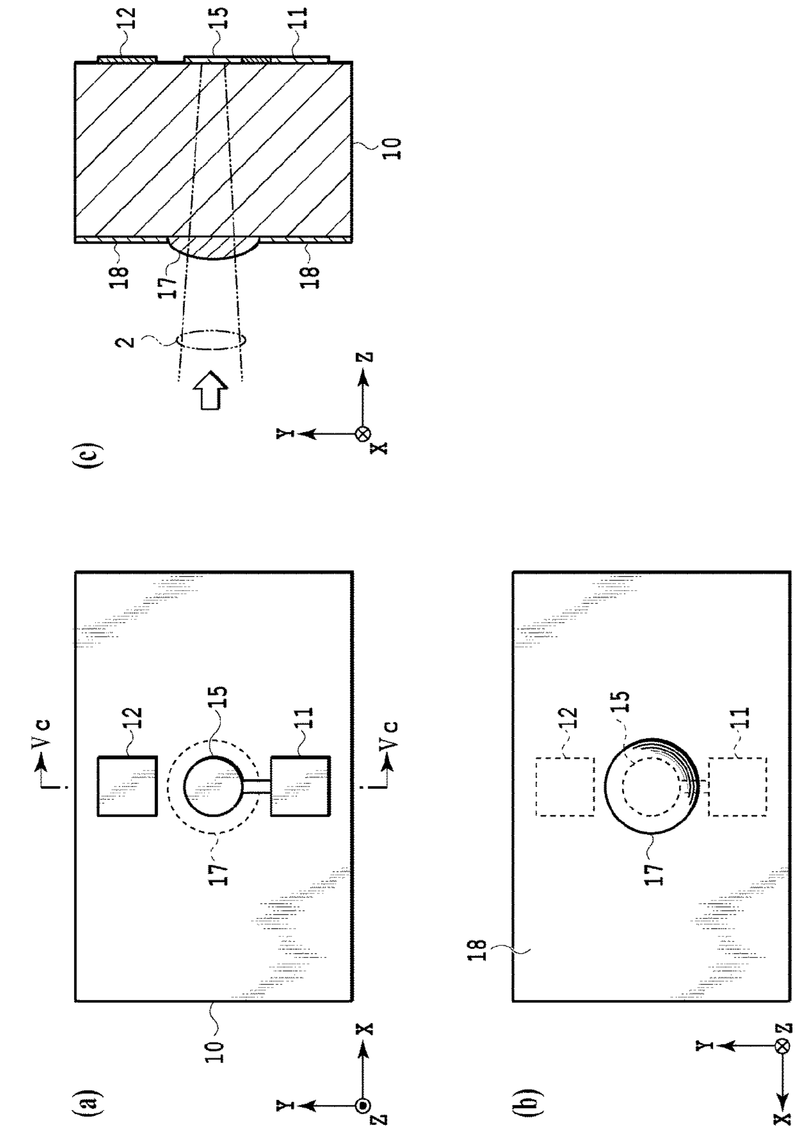
FIG. 5 is a diagram showing a configuration of a light receiving element according to a second embodiment.

FIG. 5 is a diagram showing a configuration of a light receiving element according to an embodiment 2. FIG. 5 (*a*) is a top view of the constituting surface (x-y surface) of the light receiving element viewed from above, FIG. 5 (*b*) is a back view of the rear side of the substituting surface, and FIG. 5 (*c*) is a cross-sectional view taken along the Vc-Vc line of (a) perpendicular to the substrate surface. The configuration and operation of outputting an electric signal from an optical signal 2 are the same as those of the light receiving element 10 of the embodiment 1 shown in FIG. 1, and only the difference from the configuration of FIG. 1 will be described.

The difference from the light receiving element of the embodiment 1 shown in FIG. 1 is that a lens 17 having a curvature at which the incident optical signal 2 is converged by the light receiving area 15 is formed in a region corresponding to the opening region of the lower surface of the PD 10. In addition, on the lower surface of the PD 10, a ground pattern 18 is formed over the entire region except the lens 17. Specifically, the lens 17 is formed on the lower surface of the PD substrate at the position of the opening region 16 shown in FIG. 1.

Figure 6:
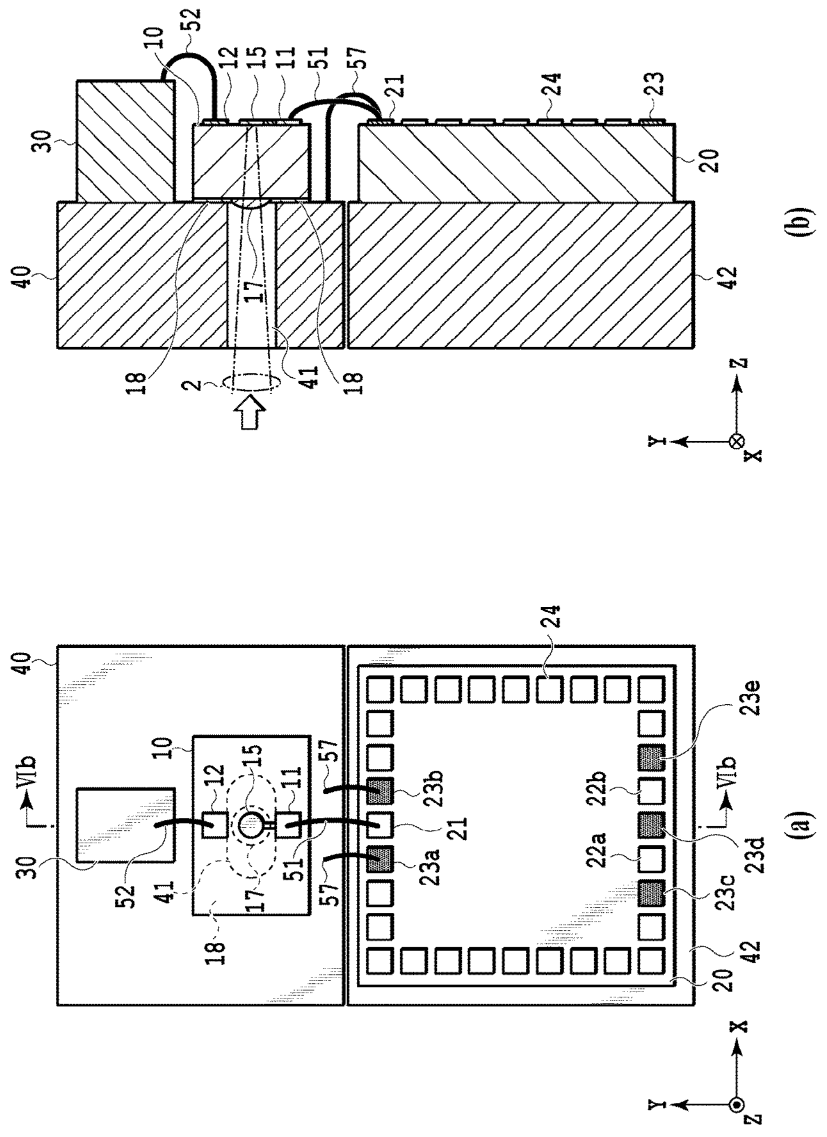
FIG. 6 is a diagram showing a mounting example of an optical receiving circuit using the light receiving element according to the second embodiment.

FIG. 6 is a diagram showing a mounting example of an optical receiving circuit using the light receiving element of the embodiment 2. FIG. 6 (*a*) is a top view of the side on which the PD chip and others are mounted, and FIG. 6 (*b*) is a cross-sectional view of the optical receiving circuit cut along line VIb-VIb in the top view of (a). The arrangement and mutual connection structure on the TIA 20 and the PD sub-mount 40 are the same as those of the conventional optical receiving circuit described in FIG. 12, and detailed description thereof is omitted. The difference between the optical receiving circuit of the prior art shown in FIG. 12 and the optical receiving circuit using the light receiving element of the embodiment 2 is that the ground pattern 18 is formed on the lower surface of the PD 10, that is, on the surface on the side in contact with the PD sub-mount 40, except for the region where the lens 17 is formed. Except that there is only the opening region 16 in the embodiment 1, while there is the lens 17 at the same region in the present embodiment, the embodiment 2 shown in FIG. 6 and the embodiment 1 shown in FIG. 2 constitute an optical receiving circuit in the same form.

Also in the light receiving element of the present embodiment, the shortest return current path can be obtained which is exactly the same as the return current path in the embodiment 1 shown in FIG. 3. That is, the high-frequency signal current 61 generated in the light receiving area 15 of the PD 10 flows into the TIA input signal pad 21 from the PD anode electrode pad 11 through the bonding wire 51. The return current flows from the TIA 20 in a reverse direction to the transmission of the signal current 61 toward the TIA 20. The return currents 67*a* and 67*b* flow from the ground pads 23*a* and 23*b* to the ground potential surface of the PD sub-mount 40 through the respective bonding wires 57.

The return currents 67*a* and 67*b* flowing from the bonding wire 57 further flow through the ground pattern 18 formed on the lower surface of the PD 10 in contact with the ground potential surface of the PD sub-mount 40 as the return currents 68*a* and 68*b*. The return current flowing through the ground pattern 18 around the lens 17 on the lower surface of the PD shown in FIG. 5 reaches the ground potential surface of the chip capacitor 30 at the shortest distance without bypassing as shown in FIG. 3. The signal current and the return current flow at the shortest distance so as to form the current loop with the minimum opening. By eliminating the bypass of the return current generated in the through-hole 41 by the ground pattern 18 around the lens 17 on the lower surface of the PD, the unnecessary resonance and the radiation noise due to the disturbance of the electromagnetic field of the high-frequency transmission line are suppressed, and flat high-frequency transmission characteristics are obtained.

Further, in the present embodiment, the lens 17 is integrated on the PD 10 to improve the optical coupling efficiency between the signal light and the light receiving area, and to prevent the mounting tolerance (tolerance of the mounting position) from being reduced. Further, since the lens not shown in the optical receiving circuit of FIG. 2 is integrated with the light receiving element in advance, the alignment work between the lens and the PD 10 becomes unnecessary, and the mounting cost can be reduced as compared with the optical receiving circuit of the embodiment 1.

In this embodiment, the lower surface of the PD 10 is formed as the opening region 16 which has the same shape as the lens 17 and in which the metal of the ground pattern is removed concentrically with the light receiving area 15. That is, the metallized entire surface is the ground pattern 18 except for the opening region 16 on the lower surface of the PD 10. As shown in FIG. 3, if the bypass of the return current due to the through-hole is eliminated and the path of the return current which becomes the shortest path is secured, the disturbance of the electromagnetic field of the high-frequency transmission line is eliminated. Therefore, the configuration of the ground pattern on the lower surface of the PD is not limited to that shown in FIG. 5. The ground pattern can be deformed as shown in FIG. 4, and partial ground patterns 19*a* and 19*b* connected in a bridge shape may be used.

In above-described each embodiment, a case of the light receiving element of a single channel in which the optical signal of the single channel is inputted and the electric signal of the single channel is outputted is shown. The configuration of the light receiving element of the present disclosure is applied to the PD array chip that receives optical signals of a plurality of channels and outputs corresponding electrical signals, thereby exhibiting an effect of achieving further excellent high-frequency transmission characteristics.

Embodiment 3

Figure 7:
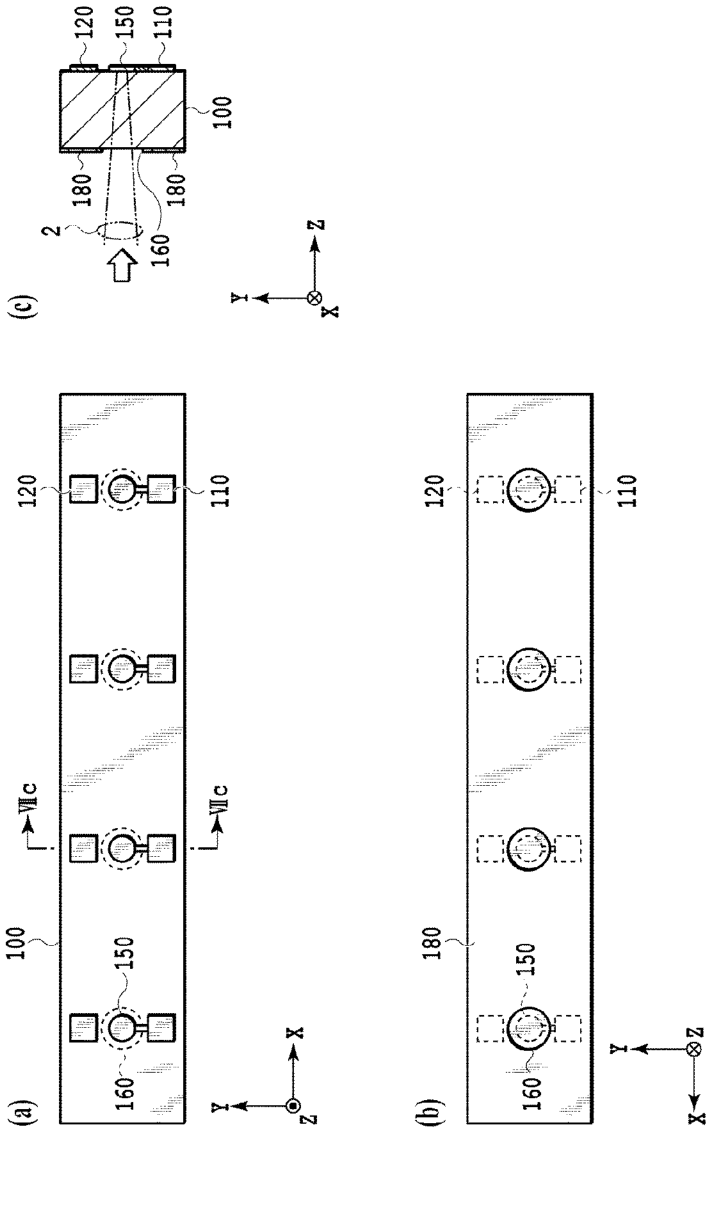
FIG. 7 is a diagram showing a configuration of a light receiving element according to a third embodiment.

FIG. 7 is a diagram showing a configuration of a light receiving element according to embodiment 3. FIG. 7 (*a*) is a top view of the constituting surface (x-y surface) of the light receiving element viewed from above, FIG. 7 (*b*) is a back view of the rear side of the substituting surface, and FIG. 7 (*c*) is a cross-sectional view of the light receiving element cut perpendicularly to the substrate surface along the line VIIc-VIIc. The light receiving element of the present embodiment is a PD array 100, in which four back-illuminated PDs 10 shown in FIG. 1 are arranged and integrated into one chip.

Each PD includes a receiving area 150, an anode electrode pad 110, and a cathode electrode pad 120, and four PDs having the same configuration are arrayed. An optical signal 2 made incident from the lower surface side of a PD array 100 is converted from the optical signal into an electric signal by the light receiving area 150 formed on the upper surface through the inside of the PD, and the electric signal is outputted from an anode electrode and a cathode electrode. The difference from the PD array 101 of the prior art shown in FIG. 15 is that an integrated ground pattern 180 is formed on the entire lower surface of the PD array 100 except for four opening regions 160 on which optical signals are incident.

Figure 8:
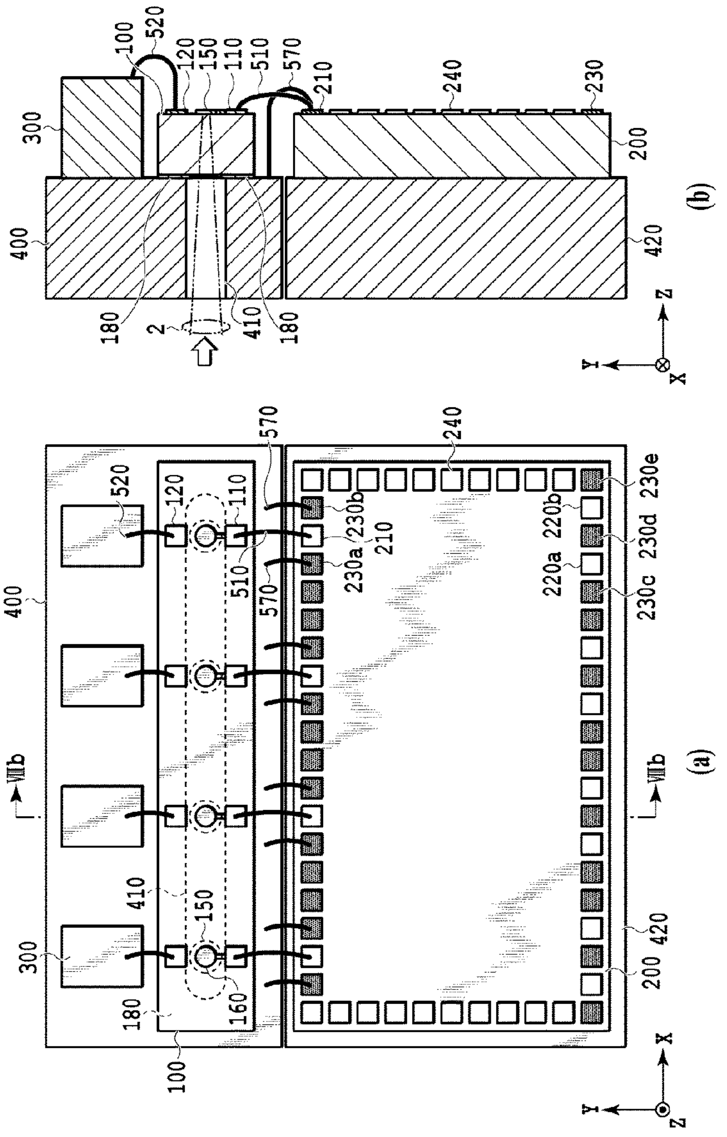
FIG. 8 is a diagram showing a mounting example of an optical receiving circuit using the light receiving element according to the third embodiment.

FIG. 8 is a diagram showing a mounting example of an optical receiving circuit using the PD array chip according to the embodiment 3. FIG. 8 (*a*) is a top view of the side on which the PD chip array or the like are mounted, and FIG. 8 (*b*) is a cross-sectional view of the optical receiving circuit cut along the line VIIIb-VIIIb in the top view of (a). The optical receiving circuit inputs optical signals 2 of four channels and outputs electrical signals of four channels. The PD array 100 and the chip capacitor 300 are mounted on a PD sub-mount 400 whose surface is metallized. A TIA 200 in mounted on a TIA carrier 420 whose surface is metallized.

A PD sub-mount 400 is provided with a single through-hole 410 large enough to provide four channels through which the optical signals of four channels are to be incident from the rear surface of the PD array 100. As described with reference to FIG. 2 with respect to the optical receiving circuit of the single light receiving element of the embodiment 1, the optical signal 2 is made incident on the PD light receiving area 150 at an angle shifted from the normal direction in order to avoid the influence of the reflected return light. The optimum incident angle varies depending on design conditions such as the optical system configuration and material of the PD, the wavelength of light, and the transmission rate handled by the PD, and a certain degree of freedom is required for the mounting position of the PD array 100. In addition, because of the processing accuracy of the ceramic which is the material of the PD sub-mount 400 and the size of the hole which can be processed, the dimensions of the end part and the short side of the through-hole 410 must be sufficiently larger than the light receiving diameter of the PD light receiving area.

The TIA chip 200 is a multi-channel TIA having amplifier circuits of four systems, has the same configuration as the TIA of the prior art described with reference to FIG. 15, and is electrically connected to the PD array 100 in the same manner as in the prior art. The difference between the optical receiving circuit of the prior art shown in FIG. 15 and the optical receiving circuit of the present embodiment is that on the lower surface of the PD array 100, that is, on the surface on the side in contact with the PD sub-mount 400, a ground pattern 180 is formed on the entire surface except four opening regions 160 on which the optical signal 2 is incident.

Figure 9:
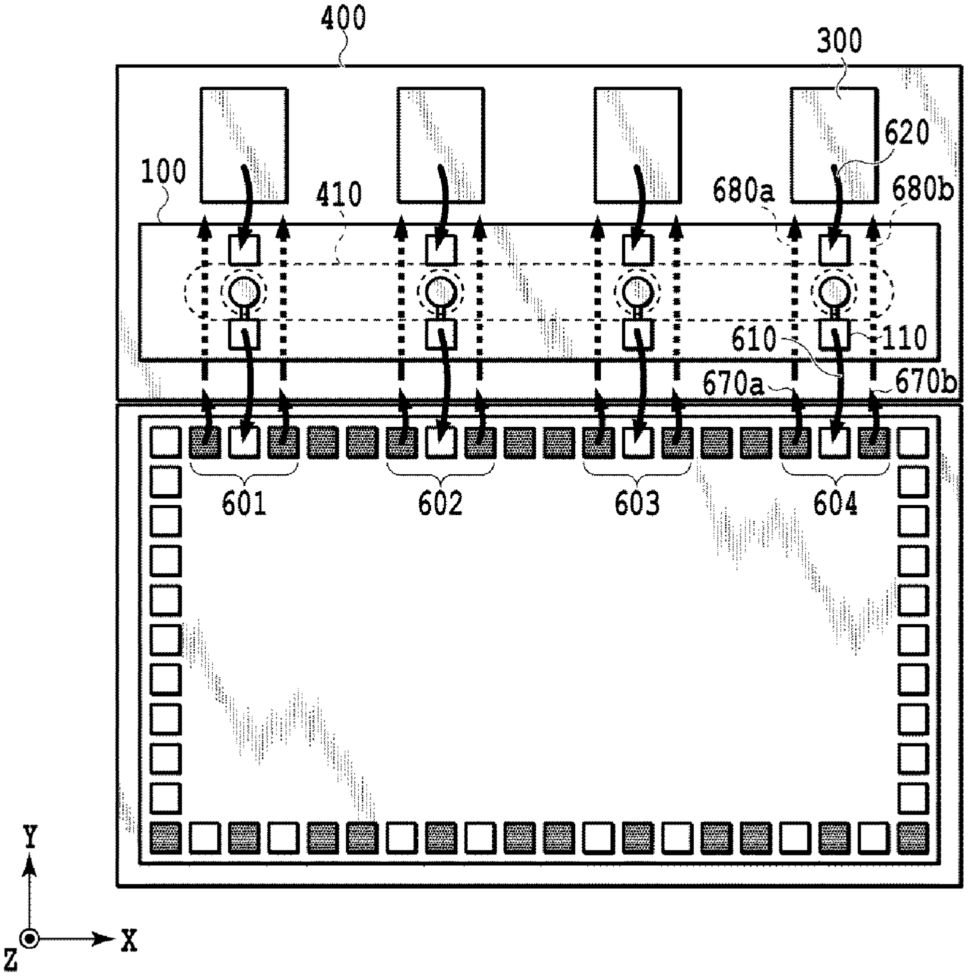
FIG. 9 is a diagram showing a path of a return current of the optical receiving circuit according to the third embodiment.

FIG. 9 is a diagram for explaining the path of the return current in the optical receiving circuit using the PD array according to the embodiment 3. In FIG. 9, in the PD array 100 of the embodiment 3 shown in FIG. 8, a photocurrent generated in the four channels 601 to 604 and the return currents corresponding to these photocurrents are indicated by arrows without drawing the bonding wires. The photocurrent generated from the signal light 2 in each PD light receiving area 150 of the four PDs flows into the TIA input signal pad 210 from the PD anode electrode pad 110 via the bonding wire 510 as a signal current 610. The cathode electrode pad 120 is grounded to the ground potential surface of the PD sub-mount 40 in terms of high frequency through the chip capacitor 300. The return currents flow from the TIA 200 to the PD in opposite directions to the transmission of four high-frequency signal currents 610 toward the TIA 200.

In the optical receiving circuit according to the PD array 100 of the embodiment 3, the return current flows linearly at the shortest distance in any of the four channels 601 to 604 of the TIA chip 200, which is greatly different from the optical receiving circuit according to the prior art shown in FIG. 17. For example, when attention is paid to the channel 604 at the right end of FIG. 9, the return currents 670*a* and 670*b* flow from ground pads 230*a* and 230*b* to the ground potential surface of the PD sub-mount 400 through respective bonding wires 570. The return currents 670*a* and 670*b* flowing from the bonding wire 570 first flow into the ground potential surface of the PD sub-mount 400. Further, the return current straight flows the ground pattern 180 formed on the lower surface of the PD 100 in contact with the ground potential surface as the return currents 680*a* and 680*b*.

When compared with the return current 694 bypassing the through-hole 410 in the conventional optical receiving circuit shown in FIG. 17, the return currents 680*a* and 680*b* flowing in the ground pattern 180 on the lower surface of the PD in FIG. 9 go straight at the shortest distance without bypassing and reach the ground potential surface just under the chip capacitor 300. The signal current and the return current flow at the shortest distance, respectively, and flow so as to form the current loop with the minimum opening. The return current also flows in the other channels 602 and 603 located inside the PD array chip so as to form the current loop having the minimum opening at the shortest distance, as in the channel 604. This is very contrast to the fact that return current 693 largely bypasses the through-hole in the channels 602 and 603 inside the PD array chip shown in FIG. 17. By eliminating the extreme bypass of the return current caused by the through-hole 410 by the ground pattern 180 on the lower surface of the PD, the unnecessary resonance and the radiation noise due to the disturbance of the electromagnetic field of the high-frequency transmission line are suppressed, and flat and excellent high-frequency transmission characteristics are obtained.

In the channel inside (center side) of the optical receiving circuit including the multi-channels, the bypass length of the return current path is large in the case of the prior art without the ground pattern 180 as shown in FIG. 17. In the optical receiving circuit of the present embodiment, the effect of improving the high-frequency transmission characteristic is large by eliminating the bypass of the return current in the channel inside (center side) of the optical receiving circuit. Further, in the channel inside the multi-channel optical receiving circuit, crosstalk from both channels is superimposed as compared with the channel outside the end of the chip. Therefore, the amount of deterioration in transmission quality due to crosstalk is increased in the channel inside the chip. In the multi-channel optical receiving circuit of the present embodiment, since the return current flows equally in any channel, the transmission quality can be remarkably improved in the channel inside the multi-channel optical receiving circuit.

Specifically, in the transmission characteristics of the four channels optical receiving circuit using the PD array of the prior art shown in FIG. 15, the ratio (crosstalk) between the self-channel signal in the inner channels 602 to 603 and the leakage signal from the adjacent channel is about 25 dB at 10 GHz. On the other hand, in the optical receiving circuit of the embodiment 3 using the light receiving element having the ground pattern on the lower surface of the PD array shown in FIG. 8, the crosstalk was about 50 dB at 10 GHz. As compared with the optical receiving circuit of the prior art, the optical receiving circuit of the embodiment 3 can confirm a significant improvement of 25 dB due to crosstalk in the channel inside the chip.

In the light receiving element of the embodiment 3 shown in FIG. 7, the entire surface of each of the four light receiving areas 150 is formed as a metal ground pattern, leaving concentric opening regions 160 at positions corresponding to the light receiving areas. If the bypass of the return current due to the through-hole is eliminated and the path of the return current can be secured so as to be the shortest path, the disturbance of the electromagnetic field of the high-frequency transmission line is eliminated. Therefore, the configuration of the ground pattern on the lower surface of the PD array is not limited to that shown in FIG. 7. For example, the shape of the opening region of the ground pattern is not necessarily concentric, and the shape is not limited as long as an opening necessary for incident light is obtained. Further, the ground pattern is not required to be the entire surface except for the opening region.

Figure 10:
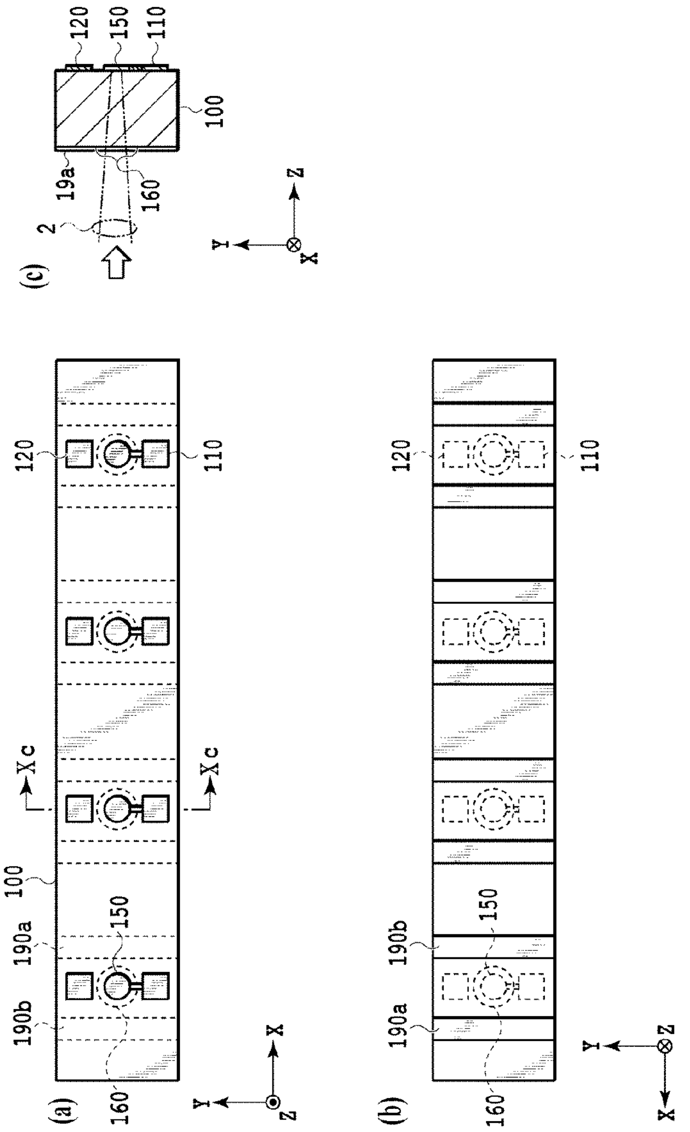
FIG. 10 is a diagram showing another configuration of a light receiving element according to the third embodiment.

FIG. 10 is a diagram showing another structure of the light receiving element of the embodiment 3. FIG. 10 (*a*) is a top view of the constituting surface (x-y surface) of the light receiving element viewed from above, FIG. 10 (*b*) is a back view of the rear side of the constituting surface, and FIG. 10 (*c*) is a cross-sectional view of the light receiving element cut perpendicularly to the substrate surface along the Xc-Xc line. The light receiving element of the modification example of FIG. 10 is a PD array 100 having substantially the same configuration as that of the PD array shown in FIG. 7. The difference from the PD array shown in FIG. 7 is that the ground pattern on the lower surface of the PD array is formed in belt-like shapes 190*a* and 190*b* which are arranged on the both sides of the opening region 160 and parallel to a straight line connecting the anode electrode pad, the light receiving element, and the cathode electrode pad.

A linear return current path from the TIA chip to the chip capacitor through the PD sub-mount and the PD array can be constituted by the belt-like ground patterns 190*a* and 190*b* connecting both sides of the PD array chip parallel to a straight line connecting the element components. The partial ground patterns 190*a* and 190*b* connecting both sides of the PD array chip in a bridge shape are provided on the lower surface of the PD array, thereby eliminating the bypass of the return current path. Usually, conductive adhesives, solder, etc. are used to fix the back-illuminated PD on the PD sub-mount whose surface is metallized. As shown in FIG. 10, by providing a space between the ground patterns 190*a* and 190*b* and the opening region 160, the conductive adhesive, solder, or the like can be prevented from flowing into the opening region 160.

Although the light receiving element of the embodiment 3 has been described with reference to an example of the light receiving element of four elements (four channels) for converting the optical signal of four channels into the electric signal of four channels, there is no limitation to the number of light receiving elements provided in the PD array. As long as one large through-hole is provided for a plurality of channels of the PD array, the bypass of the return current is a common problem of the PD array regardless of the number of channels. When the number of the light receiving elements is two or more, the problem of bypass of the return current is solved by providing the ground pattern on the lower surface of the PD array.

As described above in detail, the light receiving element and the optical receiving circuit of the present disclosure realize excellent high-frequency transmission characteristics. In the multi-channel PD array, the unnecessary resonance and the radiation noise are suppressed, and the inter-channel crosstalk is effectively reduced.

INDUSTRIAL APPLICABILITY

The present invention can be used for optical communication.

The invention claimed is:

1. A light receiving element comprising:
a light receiving area for an optical signal;
an anode electrode pad being connected to an anode of the light receiving area;
a cathode electrode pad being connected to a cathode of the light receiving area, the light receiving area, the anode electrode pad and the cathode electrode pad being formed on one surface of a substrate; and
a ground pattern being formed outside an opening region on an opposite surface of the substrate, the opening region being located at a position corresponding to the light receiving area,
wherein the anode electrode pad, the light receiving area, and the cathode electrode pad are arranged in a line, and
the ground pattern has a belt-like shape parallel to the line on both sides of the opening region.

2. The light receiving element according to claim 1, wherein
the optical signal incident into the opening region is passed through the inside of the substrate and received by the light receiving area.

3. The light receiving element according to claim 1, wherein a lens is formed at the opening region.

4. The light receiving element according to claim 1, wherein
the light receiving area, the anode electrode pad, and the cathode electrode pad constitute a unit element, and a plurality of the unit elements are arrayed.

5. An optical receiving circuit comprising:
a sub-carrier having a metalized surface;
a light receiving element on the sub-carrier having
a light receiving area for an optical signal,
an anode electrode pad being connected to an anode of the light receiving area,
a cathode electrode pad being connected to a cathode of the light receiving area constituted on one surface of the substrate, the light receiving area, the anode electrode pad and the cathode electrode pad being formed on one surface of a substrate, and
a ground pattern being formed outside an opening region on an opposite surface of the substrate, the opening region being located at a position corresponding to the light receiving area; and
a transimpedance amplifier having
a signal pad being electrically connected to the anode electrode pad, and
a ground pad being electrically connected to a metallized ground surface of the sub-carrier,
wherein a signal current flows from the cathode electrode pad to the signal input pad, while a return current flows through a path including the ground pattern from the ground pad.

* * * * *